United States Patent
Mercier Des Rochettes et al.

(10) Patent No.: US 10,236,435 B2
(45) Date of Patent: Mar. 19, 2019

(54) PLANAR PIEZOELECTRIC ACTUATOR PROVIDING A LARGE SHEAR MOVEMENT

(71) Applicant: OFFICE NATIONAL D'ÉTUDES ET DE RECHERCHES AÉROSPATIALES (ONERA), Palaiseau (FR)

(72) Inventors: Hugues Mercier Des Rochettes, Bondues (FR); Didier Joly, Sainghin en Weppes (FR)

(73) Assignee: OFFICE NATIONAL D'EÉTUDES ET DE RECHERCHES AÉROSPATIALES (ONERA), Palaiseau (FR)

( * ) Notice: Subject to any disclaimer, the term of this patent is extended or adjusted under 35 U.S.C. 154(b) by 319 days.

(21) Appl. No.: 15/022,790

(22) PCT Filed: Sep. 11, 2014

(86) PCT No.: PCT/FR2014/052249
§ 371 (c)(1),
(2) Date: Mar. 17, 2016

(87) PCT Pub. No.: WO2015/040309
PCT Pub. Date: Mar. 26, 2015

(65) Prior Publication Data
US 2016/0233412 A1 Aug. 11, 2016

(30) Foreign Application Priority Data
Sep. 20, 2013 (FR) ..................... 13 59055

(51) Int. Cl.
*H01L 41/04* (2006.01)
*H01L 41/09* (2006.01)
(Continued)

(52) U.S. Cl.
CPC ...... *H01L 41/0993* (2013.01); *H01L 41/0471* (2013.01); *H01L 41/082* (2013.01);
(Continued)

(58) Field of Classification Search
CPC ............. H01L 41/0993; H01L 41/0471; H01L 41/082; H01L 41/183
(Continued)

(56) References Cited

U.S. PATENT DOCUMENTS

2006/0016055 A1* 1/2006 Wilkie ................. H01L 41/082
29/25.35
2011/0211959 A1 9/2011 Bianchi et al.

FOREIGN PATENT DOCUMENTS

EP 2 363 342 A1 9/2011

OTHER PUBLICATIONS

Written Opinion of the International Searching Authority dated Dec. 5, 2014, issued in corresponding International Application No. PCT/FR2014/052249, filed Sep. 11, 2014, 4 pages.
(Continued)

*Primary Examiner* — Derek Rosenau
(74) *Attorney, Agent, or Firm* — Christensen O'Connor Johnson Kindness PLLC

(57) ABSTRACT

An actuator providing a large shear movement in a chosen direction. The angle of inclination of the fibers relative to the chosen direction is larger than 2° and smaller than 40°; the spaces between the piezoelectric fibers of the active layer are filled with an incompressible elastic material; the active layer comprises at least two dimensionally stable elongate elements parallel to the chosen direction; the ends of each fiber are adhesively bonded to said dimensionally stable elements using a rigid adhesive; and said dimensionally stable elements are adhesively bonded, by a rigid adhesive, to said electrode-bearing layers.

13 Claims, 3 Drawing Sheets

(51) Int. Cl.
| | | |
|---|---|---|
| H01L 41/37 | (2013.01) | |
| H01L 41/18 | (2006.01) | |
| H01L 41/047 | (2006.01) | |
| H01L 41/08 | (2006.01) | |
| H01L 41/27 | (2013.01) | |

(52) U.S. Cl.
CPC ............ H01L 41/183 (2013.01); H01L 41/27 (2013.01); H01L 41/37 (2013.01)

(58) Field of Classification Search
USPC .................................................. 310/328, 800
See application file for complete search history.

(56) References Cited

OTHER PUBLICATIONS

International Preliminary Report on Patentability dated Mar. 22, 2016, issued in corresponding International Application No. PCT/FR2014/052249, filed Sep. 11, 2014, 1 page.

International Search Report dated Dec. 5, 2014, issued in corresponding International Application No. PCT/FR2014/052249, filed Sep. 11, 2014, 2 pages.

* cited by examiner

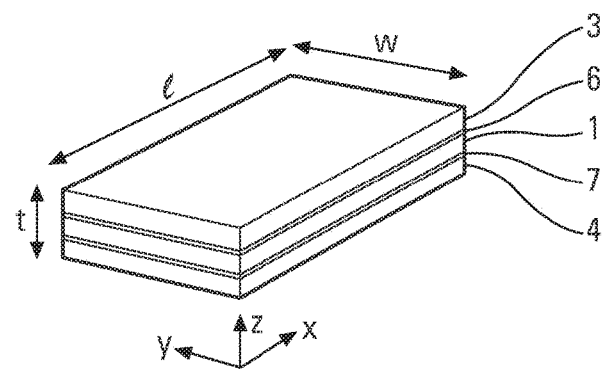
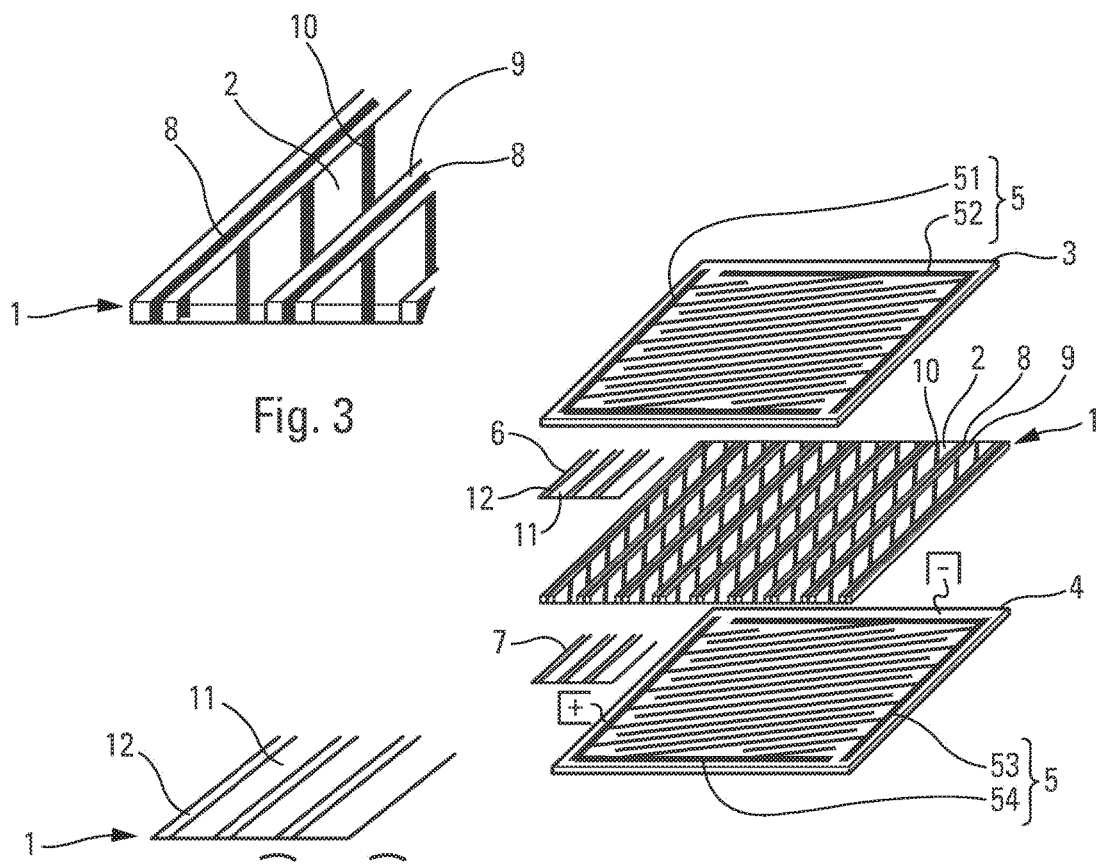

PLANAR PIEZOELECTRIC ACTUATOR PROVIDING A LARGE SHEAR MOVEMENT

TECHNICAL FIELD

Embodiments of the disclosure relate to an active actuator able to provide a planar shear movement. Some embodiments relate more particularly to actuators using piezoelectric fibers.

BACKGROUND

Flat actuators, formed from layers of piezoelectric fibers parallel to one direction and sandwiched between layers carrying electrodes oriented perpendicularly to these fibers in order to activate them, have already been developed in order to slide two structure elements with respect to each other. The applications sought in aeronautics are for example the controlled deformation of an aerodynamic element in order to adapt it according to its variations in incidence.

In this type of application, the performance of the actuator in the shear direction is expressed by the value of the corresponding angular distortion.

The applicant has already proposed, in the document FR 2 893 783, a rectangular flat actuator producing a shear in the direction of its long edge, consisting of an active layer of piezoelectric fibers sandwiched between two layers carrying parallel electrodes, themselves each covered with a layer of fabric with rigid warp and weft oriented in two directions forming a mesh. The weft and warp define a mesh of juxtaposed deformable parallelograms. The piezoelectric fibers form an angle of 45° with the long edge and 90° with the electrodes. The various layers are adhesively bonded to each other so as best to transmit the shear movement of the planar layer of piezoelectric fibers. The layers of fabric with rigid warp and weft provide both the transmission of the shear movement to the members on which the actuator is installed and the rigidity of the device in the other directions.

The drawback of this device is the limited amplitude of the angular distortion allowed by an elementary module of this type of actuator. Whatever the piezoelectric material used in the fibers, the tests carried out by the applicant result in a mean angular distortion of 1256 µclef at 45° for a fiber deformation of 800 µdef.

SUMMARY

One object of the disclosure is to obtain much greater values of the angular distortion with an actuator using a layer of piezoelectric fibers. This requires firstly increasing the value of the angular distortion produced by the movement of the piezoelectric fibers, secondly guaranteeing the level of force produced by the actuator in the shear direction.

To this end, the disclosure relates to a piezoelectric actuator with a large shear movement in a chosen direction, having a sandwich structure comprising at least one active layer comprising piezoelectric fibers parallel to one another and inclined with respect to the direction, the active layer being placed between at least two layers carrying electrodes disposed so as to be able to cause on command a variation in length of the fibers. This actuator is characterized in that:
the angle of inclination of the fibers with respect to the chosen direction is greater than 2° and less than 40°;
the spaces between piezoelectric fibers in the active layer are filled with an incompressible elastic material with a dielectric strength greater than that of the fibers;
the active layer comprises at least two elements referred to as non-deformable elements, these elements being elongate and parallel to the chosen direction and having a tensile modulus of at least 200 GPa;
the ends of each of the fibers are adhesively bonded to the non-deformable elements by means of a rigid glue;
the non-deformable elements are adhesively bonded, with a rigid glue, to the electrode-carrying layers.

The combination of non-deformable elements and the matrix consisting of the incompressible elastic material in the inter-fiber spaces makes it possible to ensure that the active layer reacts to the tensile forces exerted in its plane, substantially like a succession of deformable parallelograms with rigid edges between two non-deformable elements.

In this configuration, it can be shown that inclining the piezoelectric fibers in a direction of less than 40° with respect to the direction of the non-deformable elements makes it possible to obtain angular distortions greater than the diagonal inclination at 45° by a factor of at least 2.

Finally, the transmission of the forces to the members to which the actuator is applied, passing through the electrode-carrying layer, takes place entirely through the rigid elements, through the rigid glues. These elements must therefore have a high tensile modulus in order to withstand, without deforming, the forces induced by the fibers. On the other hand, this transmission mode eliminates the losses caused by the shear strength in the layers of glue responsible for transmitting the forces between the active layers and the other elements of the sandwich, as exist in the prior embodiments.

Advantageously, the angle of inclination of the piezoelectric fibers with respect to the chosen direction is less than 10°. This is because the angular distortion increases greatly when the inclination of the fibers decreases and is theoretically four times greater than the value obtained for 45°, starting from this inclination.

In some embodiments, the piezoelectric fibers are connected to the electrode-carrying layer by an elastic material having a shear modulus of less than 10 MPa. This layer of elastomer makes it possible to avoid electrical breakdowns by keeping the distance between the piezoelectric fibers and the electrodes substantially constant. On the other hand, its low modulus means that it opposes a low shear strength to the movement of the fibers and that it therefore reduces the force exerted by the actuator only a little.

In some embodiments, the electrode-carrying layer is produced from non-conductive material manufactured from polyamide. This type of material withstands well the angular shearing imposed by the actuator in operation.

Advantageously, the two edges of the actuator that are parallel to the chosen direction of the active layer are each formed by one of the non-deformable elements. This configuration has the advantage, inter alia, that the movements can be transmitted to the actuated members only by these two non-deformable elements.

Embodiments of the disclosure also relate to a method for producing a piezoelectric actuator with a large shear movement in a chosen direction, having a sandwich structure comprising at least one active layer comprising piezoelectric fibers parallel to one another and inclined with respect to the direction, the active layer being placed between at least two electrode-carrying layers disposed so as to be able to cause on command a variation in length of the fibers. This method is characterized by the following operations:

producing the active layer, by:
  positioning the piezoelectric fibers with an angle of inclination greater than 2° and less than 40° with respect to the chosen direction;
  filling the spaces between piezoelectric fibers with an incompressible elastic material with a dielectric strength greater than that of the fibers;
  placing, in parallel with the chosen direction, at least two elements from the non-deformable elements, these elements being elongate and having a tensile modulus of at least 200 GPa;
  adhesively bonding, with a rigid glue, the ends of each of the fibers to the non-deformable elements;
  adhesively bonding, with a rigid glue, the non-deformable elements to the electrode-carrying layers.

Advantageously, the step of positioning the piezoelectric fibers is performed by sawing a sheet of the material making up the piezoelectric fibers manufactured substantially to the dimensions of the active layer.

In some embodiments, the non-deformable elements are placed in grooves formed in the shearing direction in a sheet substantially to the dimensions of the active layer composed, over its entire extent, of piezoelectric fibers separated by bands of elastic material.

According to these last two features, producing a block makes it possible to save on time while ensuring regular positioning of the elements and evenness of the actuator on its surface.

Embodiments of the disclosure also relate to an at least partially deformable aerodynamic element comprising a piezoelectric actuator as described above.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

FIG. 1 schematically shows the structure in superimposed layers of a rectangular planar actuator according to the disclosure.

FIG. 2 schematically shows an exploded view of the various layers making up the actuator.

FIG. 3 shows a schematic detail of the active layer containing the piezoelectric fibers.

FIG. 4 shows a schematic detail of the intermediate layer providing the connection between the active layer and the electrode-carrying layer.

DETAILED DESCRIPTION

Figure 5:
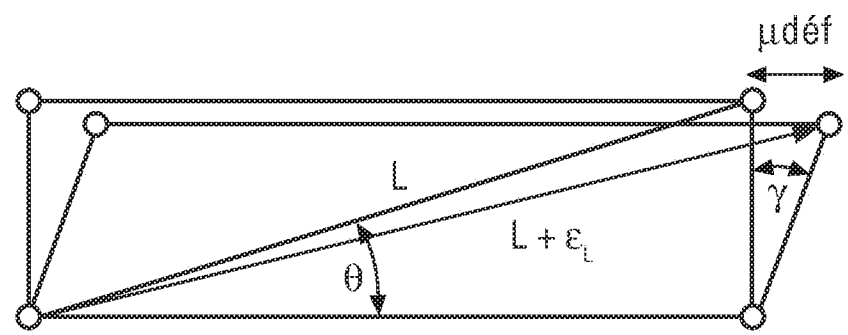
FIG. 5 schematically illustrates the theoretical deformation of an articulated rigid frame subjected to elongation of its diagonal.

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

An example of a planar actuator, shown in FIG. 1, has a rectangular form of thickness t in the direction Z, of length l in the direction X, which represents its largest dimension, and of width w in the direction Y. This actuator has a sandwich structure composed of the following elements:
  in the central plane XY, a layer 1 comprising the piezoelectric fibers 2,
  planar layers, 3 and 4, carrying the electrodes 5 activating the piezoelectric fibers 2 placed on either side in the direction Z, and
  intermediate layers, 6 and 7, of glue providing the connection between the central layer and the electrode-carrying layers.

The central layer 1 (FIG. 2) is composed of an alternation in the direction Y of bands comprising the piezoelectric fibers 2 and of filiform bars 8. Each long edge, in the direction X, of the central layer 1 is formed by a filiform bar. This layer is preferably approximately 180 μm thick.

The filiform bars 8 have a rectangular cross section, with a width of around 350 μm, and are parallel to the long edge in the direction X and spaced apart, for example, by 1 to 2 mm. These filiform bars 8 are made from highly insulating materials with a high tensile modulus, of at least 200 GPa, which makes them non-deformable elements. Materials with a high dielectric strength and a high tensile modulus such as silicon carbide and boron are preferably used.

Between these filiform bars 8, piezoelectric fibers 2 with a rectangular cross section are disposed, forming an angle θ with the direction X. This angle is chosen in the range between 2° and 40°. The properties of the actuator according to the value chosen are disclosed later, during the description of its functioning. For example, the width of these fibers is around 150μ. The material of these fibers 2 is of the MFC (macro-fiber composite) type, preferably to be taken from the following list: PZT-SA, PZT-5H or PMN-32% PT single crystal.

The piezoelectric fibers 2 are adhesively bonded at both ends thereof to the filiform bars 8 with epoxy rigid glue 9.

The gap between two fibers 2 is filled with an elastomer 10, which is preferably incompressible, with a low shear modulus, preferably less than 20 MPa. The dielectric strength of this elastomer 10 is also preferably greater than that of the piezoelectric fibers 2. The width of the band of elastomer 10 between two fibers 2 is preferably approximately 55μ. The minimum width of these gaps is limited firstly by the need for the elastomer to withstand the deformation of the actuator, and secondly by the dielectric strength of this elastomer 10, so that there is no electrical breakdown between the regions with opposite polarities on the piezoelectric fibers 2.

The planar layers 3, 4 carrying the electrodes 5 are formed by a thin film of polyamide material of the Kapton (registered trade mark) type. Preferably, the thickness of the film is approximately 0.3 mm. The electrodes are embedded in the film of the planar layer and are formed by two series of elongate interdigitated electrodes (51 and 52 for the top layer and 3, 53 and 54 for the bottom layer 4). These electrodes 5 are oriented perpendicular to the piezoelectric fibers 2.

The intermediate layers 6 and 7, providing the connection between the layer 1 of piezoelectric fibers and the electrode-carrying layers 3 and 4, are composed, as depicted in FIG. 3, of parallel bands in the direction X:

at the space occupied by the piezoelectric fibers 2, by an elastomer 11 with a low shear modulus, typically less than 10 MPa;

at the filiform bars 8, by a rigid glue of the epoxy type.

The thickness of these layers, for example around 20μ, is limited to what is necessary to ensure the rigid connection between the filiform bars 8 and the electrode-carrying layers 4 and 5.

The functioning of the actuator according to the disclosure is such that, when the piezoelectric fibers 2 are energized by means of the interdigitated electrodes 51, 52, 53 and 54, secured to the electrode-carrying layers 4 and 5, made from Kapton, the fibers 2 elongate while bearing at each of their ends on the filiform bars 8, which move in opposite directions.

Figure 6:
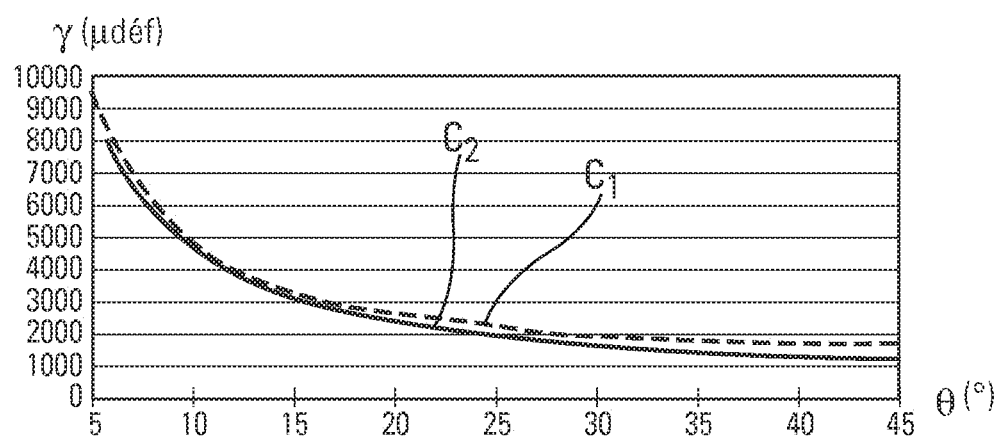
FIG. 6 shows a schematic comparison between the angular distortions of a rigid frame (C1) and of a sandwich formed by two rigid bars connected by an elastomer (C2), obtained for various values of inclination of the diagonal.

Unexpectedly, the assembly formed by the filiform bars 8 and the elastomer 10 placed between the piezoelectric fibers 2 behaves substantially as a deformable frame having rigid edges, the diagonal of which is inclined by an angle θ with respect to the long edges consisting of filiform bars 8. When such a frame, depicted in FIG. 5, is subjected to a longitudinal deformation $\varepsilon_L$, imposed in the direction of its diagonal, the angular distortion γ obtained increases very quickly when the inclination θ of this diagonal decreases. FIG. 6 shows a comparison of the value of the angular distortion γ obtained for a deformation $\varepsilon_L$ equal to 800 μclef, with a rigid frame by an analytical calculation ($C_1$), and with a frame consisting of two rigid elements connected by an elastomer similar to the one used between the piezoelectric fibers 2 by a numerical calculation ($C_2$). The very similar results of angular distortions show that the active layer 1 can behave substantially as a rigid frame articulated by means of the elastomer 10 situated between the fibers 2.

Moreover, these results illustrate the fact that, for a given elongation of the piezoelectric fibers 2, it is possible to obtain appreciably greater angular distortions when the inclination of the fibers is small. In addition, this shearing is transmitted to the electrode-carrying Kapton layers since they are adhesively bonded to the filiform bars 8 by the epoxy glue 12 with a high rigidity modulus.

Moreover, the lower the forces opposing the elongation of the fibers, the greater is such elongation. The shearing created by the actuator at its center is therefore greater when:

the shear modulus of the elastomer 9 between the piezoelectric fibers 2 is small, thus reducing the rigidity of the frame formed with the filiform bars 8;

the shear modulus of the elastomer 11 connecting the fibers 2 to the electrode-carrying layers 3 and 4 is small, thus reducing the influence of the rigidity of the electrode-carrying layers on the deformation of the piezoelectric fibers.

Because of the evaluation of the rigidity of the assembly opposing the work of the fibers 2 and because of the angular distortion value γ for small angles θ, an actuator according to the disclosure is preferably produced with an inclination of the fibers of less than 10°. However, the smaller this angle, the smaller the number of fibers 2 for a given actuator surface area. It therefore appears that there will be a value below which the force exerted by the fibers will not be sufficient to overcome the shearing of the elastomer 9 between the filiform bars 8. It is for this reason that a limit 2° less than this inclination is fixed here for a practical embodiment.

In order to illustrate the performance that can be expected of a sensor according to the disclosure, calculations were carried out to model the response of an elementary module formed by two filiform bars 8 connected by piezoelectric fibers inclined at 10°. The two modules differ on account of their lengths and widths: 5.2×1.2 mm for the first, 10.5×2.2 mm for the second. Otherwise, the other characteristics, summarized in the following table, are identical:

| | |
|---|---|
| Thickness of the active layer 1 | 180μ |
| Thickness of the electrode-carrying layers 3 and 4 | 20μ |
| Thickness of the connecting layers 6 and 7 | 30μ |
| Shear modulus of the elastomer (polyol) 10 between the adjacent fibers, and 11 between the fibers and the electrode-carrying layers | 0.1 MPa |
| Shear modulus of the epoxy glue 9 between the filiform bars and the fibers, and 12 between the filiform bars and the Kapton layers | 1200 MPa |
| Tensile modulus of the material (steel) of the filiform bars 8 | 210 GPa |

The other dimensional characteristics are those already cited as an example in the description of the embodiment. The piezoelectric fibers 2 are made from 1000 volt PZT5A so as to obtain a fiber elongation, denoted $\varepsilon_L$, of around 800 μdef. The electrode-carrying layers 3 and 4 are made from Kapton.

The angular distortion is evaluated at the center of the Kapton film forming an electrode-carrying layer 3. This value is compared with that obtained with a sensor according to the prior art, the fibers of which are inclined at 45° and also subjected to a voltage of 1000 V. This sensor has a length of 85 mm and a width of 28 mm. The results are set out in the following table:

| Type of actuator | Orientation of fibers | Elongation of fibers $\varepsilon_L$ | Angular distortion of the Kapton γ | Gain |
|---|---|---|---|---|
| Prior art | 45° | 800 μdef | 1200 μdef | 1 |
| First module | 10° | ≈800 μdef | 2360 μdef | 2 |
| Second module | 10° | ≈800 μdef | 2450 μdef | 2 |

Figure 7:
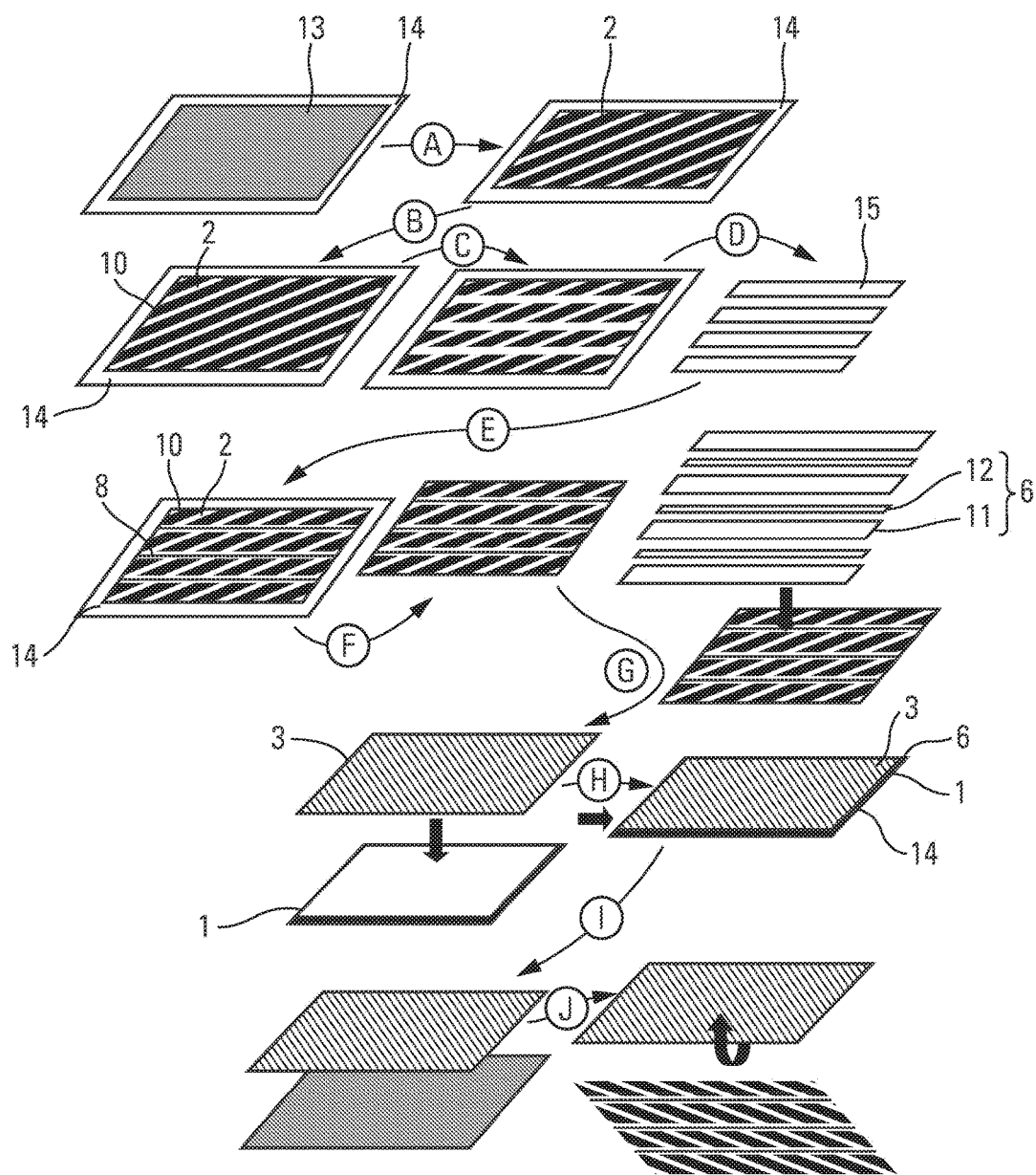
FIG. 7 schematically shows the steps of manufacturing an actuator according to the disclosure.

Moreover, the method for manufacturing the example of an actuator described previously is illustrated in FIG. 7. It uses at the start a sheet 13 of PZT adhesively bonded to a polymer film 14, such as can be obtained by a known manufacturing method. This sheet is to the dimensions of the active layer 1 of the actuator finally produced.

A first step A consists of sawing this sheet in order to form parallel strips 2 of piezoelectric fibers, inclined by an angle θ with respect to the long edge of the sheet. The separation of the fibers 2 corresponds to their separation in the actuator. Moreover, complete sawing of the polymer film 14 supporting the assembly is avoided.

In a step B, the interstices between piezoelectric fibers 2 are filled with the elastomer 10 of the active layer 1.

In a step C, sawing is carried out in the direction of the length of the assembly, fibers 2 and elastomer 10, without attacking the polymer film 14, in order to form longitudinal grooves in as many locations as there will be filiform bars 8.

Step D consists of depositing a protective cover 15 on the longitudinal bands comprising the fibers 2.

Step E consists of placing the filiform bars 8 in the longitudinal locations and adhesively bonding them to the piezoelectric fibers 2 with the epoxy glue 9.

Step F consists of removing the protective covers 15.

Step G consists of placing the films of epoxy glue 12 on the top face of the active layer 1 thus created, opposite the filiform bars 8, and placing the elastic films 11 opposite the bands containing the piezoelectric fibers 2.

Step H consists of placing the electrode-carrying layer 3 with its electrodes 5 and then connecting it to the active layer 1 by a polymerization of the films 12 and 11.

During a step I, the polymer film is removed and then in a step J the two layers thus obtained are turned over.

Next, steps G and H are performed on the other side of the active layer 1 in order to place the second electrode-carrying layer 4.

This type of actuator can advantageously be used in aeronautical applications, in particular for modifying the shape of an aerodynamic element. For example, the patent application FR 2 924 681 describes the use of planar actuators inserted in the structure of a blade of a rotating wing in order to deform it torsionally by a relative sliding of the parts situated around a slot oriented substantially in the direction of the wing span. In addition, the amplitude of the sliding must be controlled during the rotation of the blade. The actuator according to the disclosure can easily be substituted for the planar actuator of the piezoelectric type already envisaged in this application. In general terms, the disclosure can be applied whenever a part of an aerodynamic element must perform sliding or rotation movements about a given position and the space allocated to the actuator is small.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The invention claimed is:

1. Piezoelectric actuator with a large shear movement in a chosen direction, having a sandwich structure comprising:
at least one active layer comprising piezoelectric fibers parallel to one another and inclined with respect to said direction, said active layer being placed between at least two layers carrying electrodes disposed so as to be able to cause on command a variation in length of said fibers, wherein
the angle of inclination of said fibers with respect to said chosen direction is greater than 2 degrees and less than 40 degrees;
spaces between piezoelectric fibers in the active layer are filled with an incompressible elastic material with a dielectric strength greater than that of said fibers;
said active layer comprises at least two elements, the at least two elements being elongate and parallel to said chosen direction and having a tensile modulus of at least 200 GPa;
the ends of each of said fibers are adhesively bonded to said at least two elements by a first rigid glue;
said at least two elements are adhesively bonded, with a second rigid glue, to said layers carrying electrodes.

2. Actuator according to claim 1, wherein the angle of inclination of said piezoelectric fibers with respect to said chosen direction is less than 10 degrees.

3. Actuator according to claim 1, wherein the piezoelectric fibers are connected to the electrode-carrying layer by an elastic material having a shear modulus of less than 10 MPa.

4. Actuator according to claim 1, wherein the electrode-carrying layer is produced from a non-conductive material that includes a polyamide.

5. Actuator according to claim 1, wherein the two edges parallel to the chosen direction of said active layer are each formed by one of said at least two elements.

6. At least partially deformable aerodynamic element comprising a piezoelectric actuator according to claim 1.

7. Actuator according to claim 1, wherein the at least two elements are non-deformable elements.

8. Actuator according to claim 1, wherein the at least two elements are dimensionally stable.

9. Method for producing a piezoelectric actuator with a large shear movement in a chosen direction, having a sandwich structure comprising at least one active layer comprising piezoelectric fibers parallel to one another and inclined with respect to said direction, said active layer being placed between at least two layers carrying electrodes disposed so as to be able to cause on command a variation in length of said fibers, said method comprising:
producing one said active layer, by:
positioning said piezoelectric fibers with an angle of inclination greater than 2 degrees and less than 40 degrees with respect to said chosen direction;
filling the spaces between piezoelectric fibers with an incompressible elastic material with a dielectric strength greater than that of said fibers;
placing, in parallel with said chosen direction, at least two elements, the at least two elements being elongate and having a tensile modulus of at least 200 GPa;
adhesively bonding, with a first rigid glue, the ends of each of said fibers to said at least two elements;
adhesively bonding, with a second rigid glue, said non-deformable elements to said layers carrying electrodes.

10. Method according to claim 9, wherein said positioning the piezoelectric fibers is performed by sawing a sheet of the material making up said piezoelectric fibers manufactured substantially to the dimensions of the active layer.

11. Method according to claim 9, wherein the at least two elements are placed in grooves formed in the shearing direction in a sheet substantially to the dimensions of the active layer composed, over its entire extent, of the piezoelectric fibers separated by bands of elastic material.

12. Method according to claim 6, wherein the at least two elements are non-deformable elements.

13. Method according to claim 9, wherein the at least two elements are dimensionally stable.

\* \* \* \* \*